(12) United States Patent
Nakamura et al.

(10) Patent No.: US 7,126,637 B2
(45) Date of Patent: Oct. 24, 2006

(54) SOLID-STATE IMAGE PICKUP APPARATUS HAVING A HERMETIC SEAL PORTION AND FABRICATING METHOD THEREOF

(75) Inventors: Tsutomu Nakamura, Nagano-ken (JP); Shigeru Hosokai, Hachioji (JP); Kenji Miyata, Okaya (JP)

(73) Assignee: Olympus Optical Co., Ltd., Tokyo (JP)

( * ) Notice: Subject to any disclaimer, the term of this patent is extended or adjusted under 35 U.S.C. 154(b) by 556 days.

(21) Appl. No.: 10/051,158

(22) Filed: Jan. 22, 2002

(65) Prior Publication Data

US 2002/0105591 A1 Aug. 8, 2002

(30) Foreign Application Priority Data

Feb. 6, 2001 (JP) .............................. 2001-029508

(51) Int. Cl.
*H04N 5/225* (2006.01)
(52) U.S. Cl. ...................... 348/340; 348/374; 257/680
(58) Field of Classification Search ................ 348/294, 348/373, 374; 257/434, 678, 687–690, 704, 257/778
See application file for complete search history.

(56) References Cited

U.S. PATENT DOCUMENTS

| 5,192,835 | A | * | 3/1993 | Bull et al. .................. 174/260 |
| 5,357,056 | A | * | 10/1994 | Nagano ....................... 174/52.4 |
| 6,130,448 | A | * | 10/2000 | Bauer et al. ................. 257/222 |
| 6,399,995 | B1 | * | 6/2002 | Nakada ....................... 257/434 |
| 6,472,247 | B1 | * | 10/2002 | Andoh et al. ................. 438/64 |
| 6,472,761 | B1 | * | 10/2002 | Nakamura ................... 257/778 |
| 6,483,179 | B1 | * | 11/2002 | Iizima et al. ................ 257/680 |
| 6,621,616 | B1 | * | 9/2003 | Bauer et al. ................. 359/273 |
| 6,774,481 | B1 | * | 8/2004 | Ono ............................ 257/704 |
| 2001/0004128 | A1 | * | 6/2001 | Park et al. ................... 257/680 |

FOREIGN PATENT DOCUMENTS

JP 7-202152 8/1995

* cited by examiner

*Primary Examiner*—Tuan Ho
*Assistant Examiner*—Gevell Selby
(74) *Attorney, Agent, or Firm*—Westerman, Hattori, Daniels & Adrian, LLP.

(57) ABSTRACT

A solid-state image pickup apparatus having over solid-state image pickup device chip a hermetic seal portion comprising a flat-plate portion of a transparent member and a frame portion formed on a side portion of a lower surface of the flat-plate portion, said frame portion including a metal wiring, a bump formed on said solid-state image pickup device chip and electrically connected to the metal wiring, and a sealing region for sealing the periphery of the bump by a sealing material, thereby achieving the solid-state image pickup apparatus capable of being packaged in a relatively small size and capable of improving throughput and at the same time having a hermetic seal portion which can be readily electrically connected to an external terminal.

5 Claims, 5 Drawing Sheets

SOLID-STATE IMAGE PICKUP APPARATUS HAVING A HERMETIC SEAL PORTION AND FABRICATING METHOD THEREOF

This application claims benefit of Japanese Application No. 2001-29508 filed in Japan on Feb. 6, 2001, the contents of which are incorporated this reference.

BACKGROUND OF THE INVENTION

The present invention relates to solid-state image pickup apparatus and fabricating method thereof having a solid-state image pickup device chip packaged in CSP (chip size package), and more particularly relates to the construction and fabricating method of hermetic seal thereof.

In recent years, there has been an advancement in size reduction for example mainly of portable equipment and, as a result, a further downsizing is demanded also of the casing and inner circuit board therefor. Of those parts to be mounted on a circuit board, semiconductor devices are not excepted from such demands for downsized equipment, and their reduction in size is also required. The same can be said about solid-state image pickup devices which are among the semiconductor devices.

A packaging system as shown in FIG. 1 has generally been used for solid-state image pickup apparatus. In particular, a solid-state image pickup device chip 101 is die-bonded to a package 102 for example of ceramics and a bonding wire 103 is used to achieve predetermined electrical connections between the solid-state image pickup device chip 101 and package 102. The solid-state image pickup apparatus is then constructed by using a step portion 104 formed at an edge of package 102 to adhere a glass lid 105 thereto to achieve a hermetic seal with providing a space over the surface of the solid-state image pickup device chip 101. It should be noted that numeral 106 in FIG. 1 denotes an external lead.

In solid-state image pickup apparatus having such construction, use of package 102 and glass lid 105 for hermetically sealing the entire solid-state image pickup device chip resulted in an increased packaging size and thus had been difficult to be applied to the fields where smaller package size was required.

To eliminate such disadvantage, the present applicant had proposed solid-state image pickup apparatus constructed as disclosed in Japanese patent laid-open application Hei-7-202152. A sectional view of such solid-state image pickup apparatus is shown in FIGS. 2 and 3. In FIG. 2, only the light-receiving area on the solid-state image pickup device chip 101 is hermetically sealed by means of a sealing member which includes a flat-plate portion 107 made of a transparent member and a frame portion 108 integrally formed therewith at a side portion of a lower surface thereof. Glass, quartz, sapphire, transparent resin or the like is used as the transparent member for constituting the flat-plate portion 107. In the solid-state image pickup apparatus shown in FIG. 3, on the other hand, instead of integrally forming a hermetic seal portion, a flat-plate portion 109 and a frame portion 110 are adhered to each other to constitute the hermetic seal portion. Here frame portion 110 may be constituted by such inorganic materials as ceramics, glass, silicon or such metal as Kovar or 42-alloy. Further, it is also possible that an epoxy, phenol, or silicone resin may be printed or pattern-formed by photolithography on the surface of the solid-state image pickup device chip 101 to form the frame portion 110.

By constructing solid-state image pickup apparatus in this manner, a smaller size packaging thereof is possible and, especially in a solid-state image pickup apparatus having a micro-lens, the solid-state image pickup apparatus can be achieved without degrading the light converging capability of the micro-lens even when such optical components as a filter, lens, prism, etc., is adhered to the surface of the hermetic seal portion. Further, fabrication method has also become simpler, since hermetic seal portions can be formed at once for all of a large number of solid-state image pickup device chips in a wafer.

The previously proposed solid-state image pickup apparatus as described above, however, has the following problems to be solved. First, the structure of the integrally formed, hermetic seal portion as shown in FIG. 2 requires an integral forming of the hermetic seal portion having a flat-plate portion and a frame portion by using such transparent material as glass. Precision in processing is thus required and difficulties such as an increased amount of work in fabrication are foreseen.

Further, the method of constructing the hermetic seal portion by adhering flat-plate portion and frame portion to each other as shown in FIG. 3, especially the method of constructing the frame portion by means of a pattern forming of resin, requires the processing steps of forming a resinous pattern, i.e., application of the resin onto a wafer, printing or photolithography, developing and etching. There is thus a problem that the number of processing steps is increased.

Furthermore, a more serious problem presumably occurs with this technique when the solid-state image pickup apparatus has a micro-lens. This is because a micro-lens, usually, is formed also from a resin. For example, after applying a resin over the entire surface of a wafer, the processing steps of patterning and etching of the frame portion must be performed before the resin cures. If etching is performed before the curing of the resin, however, the resin capable of becoming the frame portion is also etched away similarly as the portion of resin to be removed and there is a possibility that a sufficient frame is not formed. If etched after the curing of the resin, on the other hand, though a desired shape for the frame is formed, there is a possibility that the micro-lens is etched away at the same time of the etching of the unnecessary portion of resin to be removed due to the fact that the micro-lens is also made of a resin.

Moreover, in those previously proposed including the packaging system as shown in FIG. 1, wire bonding must be performed to connect the I/O pad of a solid-state image pickup device chip and the electrodes of the package. An increased number of I/O terminals in the solid-state image pickup device chip results in an increase in the processing time of wire bonding for the I/O pad (terminals) and affects the throughput.

As the above, those previously proposed are with various problems in the construction of hermetic seal portion, even though smaller size packaging is possible and hermetic seal portions can be formed at once for all chips in the form of a wafer.

SUMMARY OF THE INVENTION

To eliminate the above problems, it is a main object of the present invention to provide a solid-state image pickup apparatus which can be packaged in a relatively small size while an improved throughput is achieved by saving the time to be spent for wire bonding and at the same time which has a hermetic seal portion readily capable of electrical connection to an external terminal.

In accordance with the invention, there is provided a solid-state image pickup apparatus fundamentally including: a solid-state image pickup device chip having a bump formed thereon, and a hermetic seal portion provided over the solid-state image pickup device chip having a flat-plate portion formed of a transparent member and a frame portion disposed on a side portion of a lower surface of the flat-plate portion, wherein the frame portion at least includes a metal wiring, a bump formed on the solid-state image pickup device chip and electrically connected to the metal wiring, and a sealed region for sealing the periphery of the bump by a sealing material.

By such construction, the solid-state image pickup apparatus can be achieved as having a relatively small size with an improved throughput by saving the time to be spent for wiring and having a hermetic seal portion readily capable of electrical connection to an external terminal through the metal wiring and the bump on the solid-state image pickup device chip. The above main object is thereby accomplished.

It is another object of the invention to provide a solid-state image pickup apparatus readily and securely capable of electric connection to an external terminal.

In a further aspect of the invention, the metal wiring of the image pickup apparatus of the above fundamental construction is formed on the side portion of the lower surface of the flat-plate portion.

By such construction, the metal wiring can be readily formed and an electric connection to an external terminal can be securely and readily effected. The above object is thereby accomplished.

It is yet another object of the invention to provide a solid-state image pickup apparatus in which a reliable hermetic seal portion can be formed by improving the strength of frame portion and at the same time a metal wiring for effecting an electric connection to an external terminal can be readily and securely formed.

In a further aspect of the invention, the frame portion of the image pickup apparatus of the above fundamental construction includes a frame base portion, wherein the metal wiring is formed on one surface of the frame base portion while the other surface of the frame base portion is adhered to the flat-plate portion.

In thus constructed solid-state image pickup apparatus, a reliable hermetic seal portion can be formed by increasing the strength of the frame base portion and at the same time a metal wiring can be readily formed and an electric connection to an external terminal can be securely and readily effected. The above object is thereby accomplished.

It is another object of the invention to provide a solid-state image pickup apparatus in which electric connection between a metal wiring of frame portion and a bump can be effected more readily and securely.

In a further aspect of the invention, an anisotropic conductive material is used as the sealing material in the image pickup apparatus of the above fundamental construction.

By thus using an anisotropic conductive material, an electrical connection can be more securely and readily effected between the metal wiring on the frame portion and the bump. The above object is thereby accomplished.

It is another object of the invention to provide a solid-state image pickup apparatus in which a screening effect against unwanted rays of light on solid state image pickup device can be imparted to the frame of a hermetic seal portion.

In a further aspect of the invention, the frame portion of the solid-state image pickup apparatus of the above fundamental construction has a function for screening light based on a coloring or the like of the sealing material or of the frame base portion.

By such construction, unwanted rays of light are screened by the frame portion so that adverse effects due to stray light or reflection on the solid-state image pickup device chip can be prevented. The above object is thereby accomplished.

It is another object of the invention to provide an optimum structure for electrical connection between solid-state image pickup device chip and an external terminal in solid-state image pickup apparatus having a hermetic seal portion.

In a further aspect of the invention, the solid-state image pickup apparatus of the above fundamental construction has a wiring region or an electrode pad region formed from an electrode pad provided on the solid-state image pickup device chip to a side surface or through a side surface to a back surface of the solid-state image pickup device chip so that an external terminal can be electrically connected to the wiring region or the electrode pad region.

By such construction, an optimum structure for electrical connection can be provided between the metal wiring provided on the frame portion and an external terminal and at the same time its application to various packaging form becomes possible. The above object is thereby accomplished.

It is another object of the invention to provide a fabricating method of solid-state image pickup apparatus capable of readily forming a hermetic seal portion accurately registered with respect to solid-state image pickup device chip.

In accordance with a further aspect of the invention, a fabricating method of solid-state image pickup apparatus having a hermetic seal portion provided over a solid-state image pickup device chip comprising a flat-plate portion formed of a transparent member and a frame portion disposed at a side portion of a lower surface of the flat-plate portion includes the steps of: over an entire wafer having a large number of solid-state image pickup device chips formed thereon, integrally and correspondingly to each individual solid-state image pickup device chip, forming a hermetic seal portion comprising a flat-plate portion made of a transparent member, and a frame portion disposed at lower surface edges of the flat-plate portion having a metal wiring, a bump formed on solid-state image pickup device chip and electrically connected to the metal wiring, and a seal region for sealing the periphery of the bump by a sealing material; and separating the wafer having the integrally formed hermetic seal portions thereon into solid-state image pickup device chips each having an individual hermetic seal portion.

By using such fabricating steps, hermetic seal portions can be formed at once on respective solid-state image pickup device chips in the form of a wafer. Accordingly, it becomes possible to readily fabricate a solid-state image pickup apparatus having a hermetic seal registered accurately on solid-state image pickup device chip. The above object is thereby accomplished.

DESCRIPTION OF THE PREFERRED EMBODIMENTS

Figure 4:
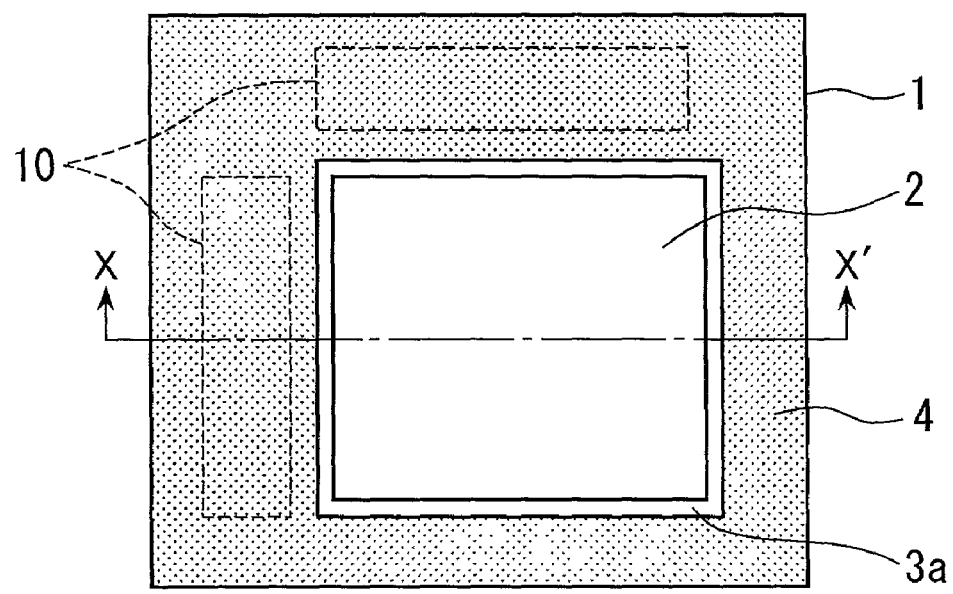
FIG. 4 is a top view showing a first embodiment of solid-state image pickup apparatus according to the invention.
Figure 5:
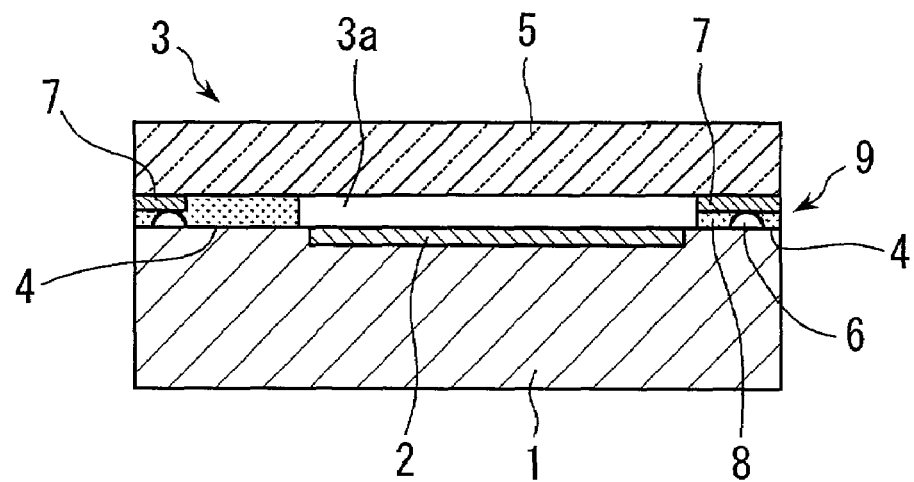
FIG. 5 shows in section the solid-state image pickup apparatus of the first embodiment in FIG. 4.

Some embodiments according to the invention will now be described. First, a first embodiment of the invention will be described below. FIG. 4 is a top view of a solid-state image pickup apparatus according to the first embodiment and FIG. 5 is a sectional view along line X–X' of FIG. 4. Referring to FIGS. 4 and 5, denoted by numeral 1 is a solid-state image pickup device chip; a bump 6 is formed on an I/O pad of the solid-state image pickup device chip 1. Bump 6 is electrically connected to a metal wiring 7 formed at a side portion of the lower surface of a flat-plate portion 5 consisting of a transparent member which is placed on the top of the solid-state image pickup device chip 1. Here, metal wiring 7 is the wiring for bringing out electrical signals from the I/O pad portion of the solid-state image pickup device chip 1 and it is an equivalent to what can be obtained by extending the I/O pad portion. Those which can be used as the material of metal wiring 7 include aluminum or Au- or Ni-plated aluminum. Any material, however, can be used as far as it has a sufficient electric conductivity and can be formed into any desired shape.

Further, the peripheral portion under metal wiring 7 except the connecting portion between metal wiring 7 and bump 6, i.e. a seal region 4 is filled with a sealing material 8. The seal region 4 is so designed that it does not overlap a light receiving portion 2 of the solid-state image pickup device chip 1. Accordingly, for the solid-state image pickup device chip 1, a frame portion 9 is formed by the seal region 4 made of sealing material 8, bump 6, and metal wiring 7. A hermetic seal portion 3 is constituted by the frame portion 9 and the flat-plate portion 5 which is formed of a transparent member. The height of the hermetically sealed region 3a is determined by the heights of bump 6 and metal wiring 7. Here, a material to be suitably used as the sealing material 8 is one having a high viscosity such as epoxy- or silicone-type synthetic resin which fills gaps on the periphery of bump 6 and at the same time does not flow into the hermetically sealed region 3a. An epoxy-type resin film or the like capable of providing a seal when bonding of the flat-plate portion 5 and the solid-state image pickup device chip 1 to each other, however, can also be used.

It is furthermore possible that an anisotropic conductive material be used to electrically connect bump 6 and metal wiring 7 to each other and at the same time that the anisotropic conductive material be used as the sealing material so as to concurrently form the seal region 4. If the anisotropic conductive material is used, the electrical connection between bump 6 and metal wiring 7 can be securely and readily effected at the same time of the forming of the seal region 4. While a film or gel-like material is used as the anisotropic conductive material, it is not limited to these and any material having the above described characteristic as the sealing material can be used. Furthermore, while Au or Ni is generally used as metal particles to be mixed into the anisotropic conductive material, any material having a sufficient electric conductivity can be used. Glass, quartz, sapphire, etc. are preferably used as the transparent member of the flat-plate portion 5. It should be noted that, in FIG. 4, numeral 10 denotes peripheral circuits such as a scanning circuit of the light receiving portion 2.

The above described construction makes it possible to achieve a solid-state image pickup apparatus having a hermetic seal portion in which downsizing is possible by making unnecessary the wire bonding at the time of packaging which has conventionally been required due to hermetic seal portion and at the same time an electrical connection to an external terminal can be readily and securely effected by the bump on the solid-state image pickup device chip and the metal wiring of the flat-plate portion.

Figure 6:
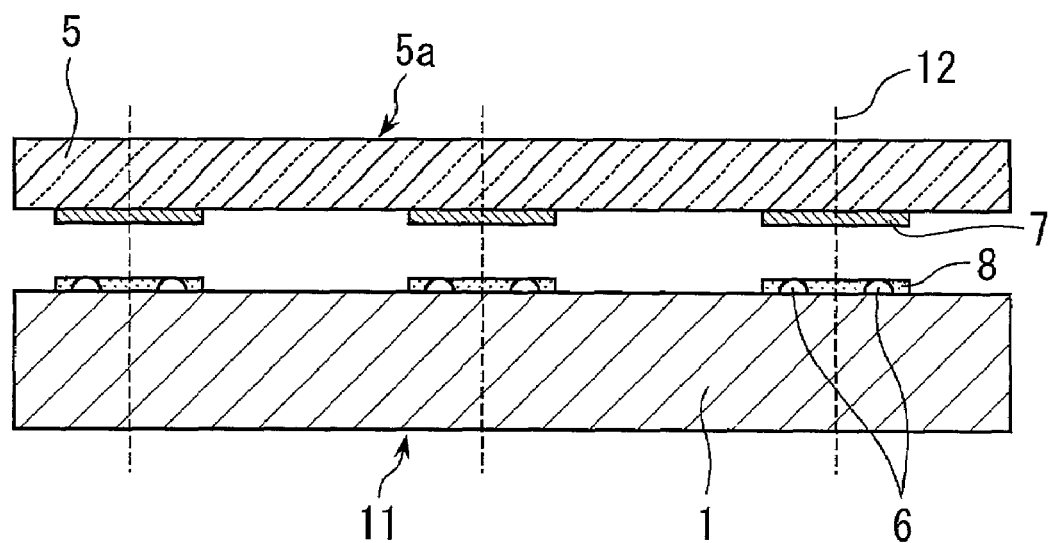
FIG. 6 shows fabrication process to explain an example of fabricating method of solid-state image pickup apparatus according to the invention.

The steps of fabricating method of the solid-state image pickup apparatus according to the above first embodiment will now be summarized. First, as shown in FIG. 6, a wafer 11 having a large number of solid-state image pickup device chips 1 formed thereon is prepared and bump 6 is formed at the I/O pad portion of each individual solid-state image pickup device chip 1 on the wafer 11. A transparent member 5a extended over the entire wafer is then prepared, which will become the individual flat-plate portions 5. Metal wiring 7 patterned correspondingly to the plurality of solid-state image pickup device chips 1 formed on the wafer 11 is integrally formed on the transparent member 5a so as to be accurately connected to bump 6. Methods to be used in forming the metal wiring 7 include the forming of wiring pattern by means of photoetching after forming a metal film uniformly over the transparent member surface by means of sputtering, vapor vacuum deposition or printing. It can be formed by using any other methods such as direct printing of wiring pattern, however, as far as a desired wiring can be formed.

Figure 7:
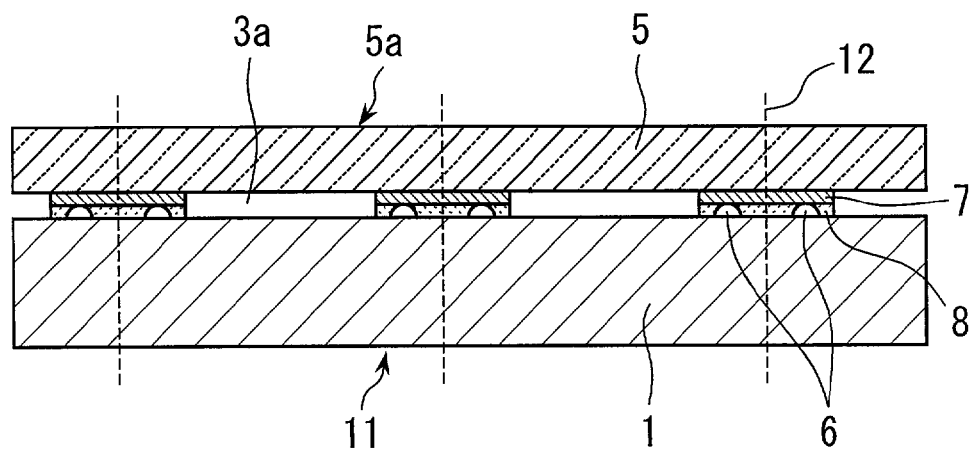
FIG. 7 shows fabrication process continued from the fabrication process shown in FIG. 6.

As shown in FIG. 7, then, wafer 11 and transparent member 5a are bonded to each other so that bump 6 on the solid-state image pickup device chip 1 and metal wiring 7 formed on the transparent member 5a are connected to each other. The sealing material 8 for forming the seal region 4, i.e. a resin, resin film, anisotropic conductive material, etc. is charged before the bonding by means of potting or pasting into the periphery of bump 6, between the bumps or onto the bumps as shown in FIG. 6. In doing so, a layout is effected so that predetermined hermetically sealed regions 3a are formed after the bonding. Lastly, the wafer 11 to which transparent member 5a has been bonded is diced along scribed lines 12 for separating it into individual solid-state image pickup apparatus. The solid-state image pickup apparatus is thereby completed as having the hermetic seal portion 3 as shown in FIG. 5 over the solid-state image pickup device chip.

Here, micro-lens or color filter for example may be formed on-chip or be formed by pasting or the like on the solid-state image pickup device chip 1. Further, the alignment mark at the time of fabricating solid-state image pickup device chip 1 can be used in bonding the transparent member 5a to the wafer 11. Since an accurate registration is thereby possible, a hermetic seal portion can be formed precisely over the solid-state image pickup device chip. Furthermore, the hermetic seal portions can be readily formed at once on all the chips in the form of a wafer.

Figure 8:
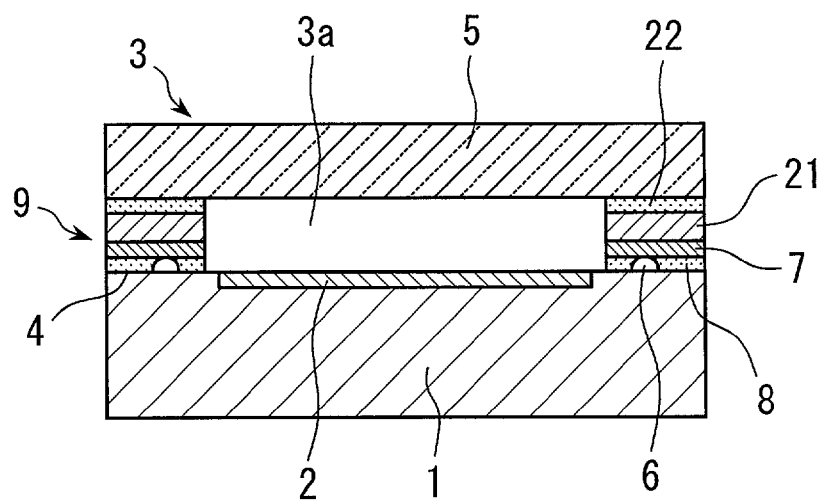
FIG. 8 is a sectional view showing a second embodiment of solid-state image pickup apparatus according to the invention.

A second embodiment of the solid-state image pickup apparatus according to the invention will now be described. FIG. 8 shows a sectional view of the second embodiment of the solid-state image pickup apparatus according to the invention. Referring to FIG. 8, denoted by numeral 1 is a solid-state image pickup device chip; a bump 6 is formed on an I/O pad of the solid-state image pickup device chip 1. A frame base portion 21 having an aperture corresponding to a light receiving portion 2 of the solid-state image pickup device chip 1 is separately prepared. Metal wiring 7 is formed on one surface of the frame base portion 21. The frame base portion 21 is so placed on the solid-state image pickup device chip 1 that metal wiring 7 is electrically connected to bump 6.

Here, metal wiring 7 is the wiring for bringing out electrical signals from the I/O pad portion of the solid-state image pickup device chip 1 and it is an equivalent to what can be obtained by extending the I/O pad portion. Those which can be used as its material include aluminum or Au- or Ni-plated aluminum. Any material, however, can be used as far as it has a sufficient electric conductivity and can be formed into any desired shape. A flat-plate portion 5 consisting of a transparent member is adhered by means of an adhesive 22 to the other surface of the frame base portion 21 placed on the solid-state image pickup device chip 1.

Further, in a similar manner as the first embodiment, the periphery of bump 6 under metal wiring 7 except the connecting portion between metal wiring 7 and bump 6, i.e. a seal region 4 is formed by filling a sealing material 8. The seal region 4 is so designed that it does not overlap a light receiving portion 2 of the solid-state image pickup device chip 1. Accordingly, a hermetic seal portion 3 is provided for the solid-state image pickup device chip 1, constituted by the frame portion 9 consisting of the seal region 4 made of the sealing material 8, bump 6 and the frame base portion 21 having metal wiring 7 formed on one side thereof, and the flat-plate portion 5 of transparent member. Here, a material to be suitably used as the sealing material 8 is one having a high viscosity such as epoxy- or silicone-type resin which fills gaps between bumps 6 and at the same time does not flow into the hermetically sealed region $^3$a. An epoxy-type resin film or the like capable of providing a seal at once at the time of bonding, however, can also be used.

It is furthermore possible that the electrical connection between bump 6 and metal wiring 7 and the forming of the frame portion 9 can be concurrently effected by using an anisotropic conductive material as the sealing material 8. While a film or a gel-like material is used as the anisotropic conductive material, it is not limited to these and any material having the above described characteristic as the sealing material can be used. Furthermore, while Au or Ni is used as metal particles to be mixed into the anisotropic conductive material, any material having a sufficient electric conductivity can be used. While a plastic, Teflon (registered trademark) or the like is used as the frame base portion 21, it is not limited to these and any insulating material capable of formed into a desired shape and having sufficient strength can be used. Glass, quartz, sapphire, etc. are preferably used as the transparent member which will become the flat-plate portion 5. An epoxy- or silicone-type resin is suitably used as the adhesive 22 for adhering the flat-plate portion 5 of transparent member and the frame base portion 21 to each other.

The above described construction makes it possible to achieve a solid-state image pickup apparatus having a hermetic seal portion in which downsizing is possible by making unnecessary the wire bonding at the time of packaging which has conventionally been required due to hermetic seal portion and at the same time an electrical connection to an external terminal can be readily and securely effected by the bump on the solid-state image pickup device chip and the metal wiring of the frame base portion. Furthermore, a more reliable hermetic seal portion can be formed by separately forming the frame base portion of the frame by using a material having a sufficient strength.

It should be noted that fabricating method of the solid-state image pickup apparatus according to the second embodiment is fundamentally identical to the fabricating method of the solid-state image pickup apparatus according to the first embodiment. By previously adhering the frame base portion having metal wiring formed on one surface thereof to the transparent member which will become the flat-plate portion, the subsequent steps can be performed similarly to the fabricating steps of the first embodiment.

In particular, instead of a transparent member having metal wiring in FIGS. 6 and 7, it suffices to use a transparent member to which a frame base portion having metal wiring formed on one surface thereof is adhered. The forming method of metal wiring onto the frame base portion can be achieved by a method similar to the forming method of metal wiring onto a transparent member as described above.

Figure 1:
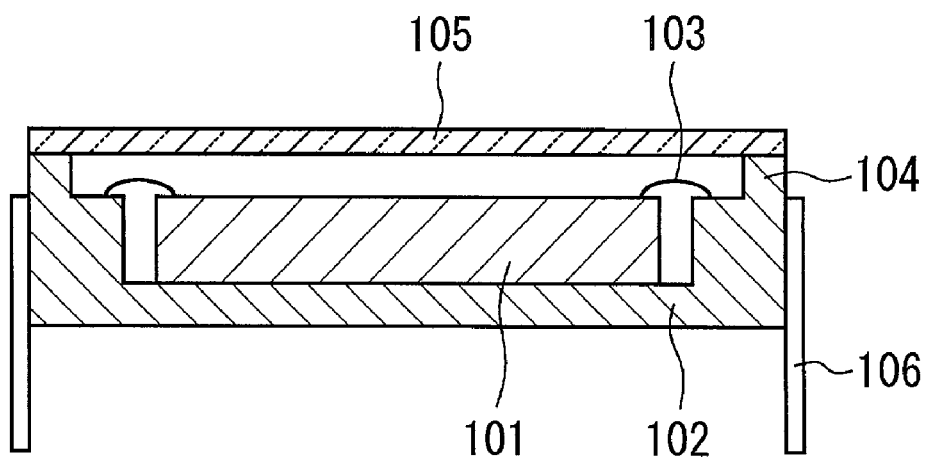
FIG. 1 is a sectional view showing an example of solid-state image pickup apparatus packaged in a conventional hermetic seal.
Figure 2:
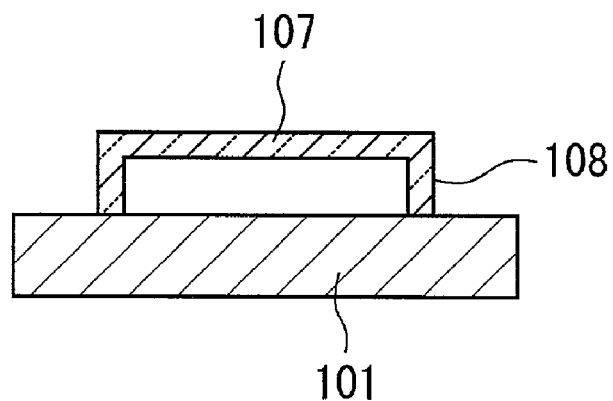
FIG. 2 is a sectional view showing an example of construction of solid-state image pickup apparatus having a hermetic seal portion previously proposed by the present applicant.
Figure 3:
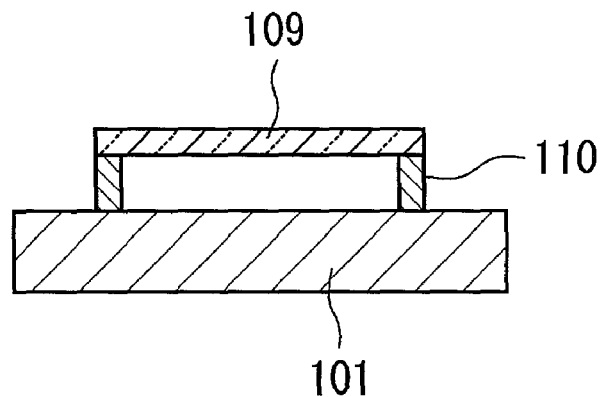
FIG. 3 is a sectional view showing another example of construction of solid-state image pickup apparatus having a hermetic seal portion previously proposed by the present applicant.
Figure 9:
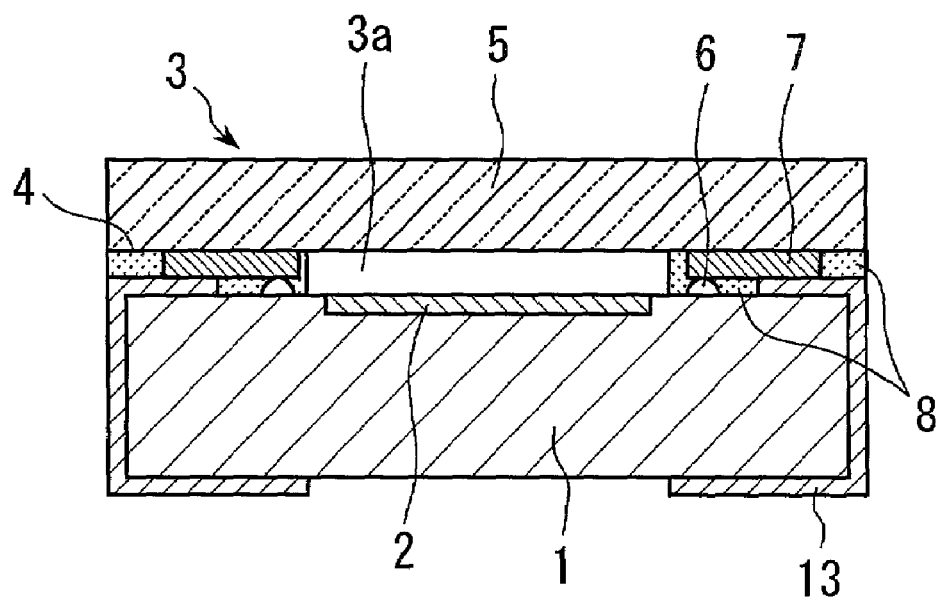
FIG. 9 is a sectional view showing a modification of the solid-state image pickup apparatus according to the first embodiment in FIGS. 4 and 5.

Moreover, as a modification of the first embodiment, it is also possible that a wiring region 13 is formed on side surfaces of or over the back through side surfaces of the solid-state image pickup device chip 1 as shown in FIG. 9. Electrode pads are newly provided on the wiring region 13 and connected to a separate board through a bump or the like. In this case, an electrical connection is provided from bump 6 on the solid-state image pickup device chip 1 through metal wiring 7 to the wiring region 13. Also in this case, the seal region 4 based on the frame portion is not required to exclude the pad portion on the solid-state image pickup device chip 1 and it suffices to form the seal region 4 of the frame portion so that the entire chip including the light receiving portion 2 or the light receiving portion 2 and its peripheral circuit portion is hermetically sealed. Furthermore, it is also possible that an electrical connection to an external terminal be achieved by connecting an external lead or the like as shown in FIG. 1 to the wiring region 13 on the chip's side surface.

By such construction, packaging becomes unnecessary and a chip-size solid-state image pickup apparatus can be directly mounted on various boards such as a circuit board on which signal processing circuits, etc. are formed. Furthermore, the pasting or adhesion to a semiconductor chip having a signal generating circuit or signal processing circuit formed thereon is readily performed by means of the wiring region or electrode pad provided on the back of the solid-state image pickup device chip. Accordingly it becomes possible to readily fabricate a layer-built solid-state image pickup apparatus where solid-state image pickup device chip, signal processing circuit, etc. are integrally formed. A further downsizing can be achieved of the solid-state image pickup apparatus including peripheral circuits.

Further in the above embodiments, the frame portion is caused to serve as a light screening portion by using the sealing material and/or frame base portion or adhesive colored for example in black so as to screen light. The solid-state image pickup device chip can be screened from the unwanted rays of light. It thus becomes possible to prevent an adverse effect for example due to stray light or reflection on the solid-state image pickup device chip.

It should be noted that, while the invention is related to solid-state image pickup apparatus which is obtained as a solid-state image pickup device chip in a hermetically sealed package, such technique for hermetically sealed packaging of solid-state image pickup device chip is well applicable to hermetically sealed packaging of other semiconductor chips. Similar advantages are expected.

As has been described, according to the invention, the solid-state image pickup apparatus can be achieved as packaged in a relatively small size with an improved throughput by saving the time and labor to be spent for wiring and having a hermetic seal portion readily capable of electrical connection to an external terminal through bump and metal wiring on the solid-state image pickup device chip. It is also becomes possible according to the invention to readily form the metal wiring and to securely and readily effect an electric connection to an external terminal. Further, according to the invention, a reliable hermetic seal portion can be formed by increasing the strength of the frame base portion and at the same time a metal wiring can be readily formed and an electric connection to an external terminal can be securely and readily effected. Further, according to the invention, by using an anisotropic conductive material as the sealing material, an electrical connection can be more securely and readily effected between the metal wiring on the frame portion and the bump. Further, according to the invention, unwanted rays of light are screened by the frame portion so that adverse effects due to stray light or reflection on the solid-state image pickup device chip can be prevented. Further, according to the invention, an optimum structure for electrical connection can be provided between the metal wiring provided on the frame portion and an external terminal. Further, by the fabricating method of solid-state image pickup apparatus according to the invention, hermetic seal portions can be formed at once on respective solid-state image pickup device chips in the form of a wafer and it becomes possible to readily fabricate a solid-state image pickup apparatus having a hermetic seal registered accurately on solid-state image pickup device chip.

What is claimed is:

1. A solid-state image pickup apparatus comprising:
    a solid-state image pickup device chip having a bump formed thereon, and
    a hermetic seal portion provided over the solid-state image pickup device chip having a flat-plate portion formed of a transparent member and a frame portion disposed on a side portion of a lower surface of the flat-plate portion;
    edge sides of said solid-state image pickup device chip and those of said hermetic seal portion being substantially coincident with each other;
    said frame portion at least including a metal wiring, said bump formed on said solid-state image pickup device chip and electrically connected to the metal wiring, and a sealed region for sealing the periphery of the bump by a sealing material;
    wherein said frame portion further includes a frame base portion and said metal wiring is formed on one surface of said frame base portion while the other surface of the frame base portion is adhered to said flat-plate portion.

2. The solid-state image pickup apparatus according to claim 1, wherein an anisotropic conductive material is used as said sealing material.

3. A solid-state image pickup apparatus comprising:
    a solid-state image pickup device chip; and
    a hermetic seal portion comprising a flat-plate portion formed of a transparent member provided over the solid-state image pickup device chip and a frame portion at least including a metal wiring disposed on a side portion of a lower surface of the flat-plate portion, a bump formed on said solid-state image pickup device chip and electrically connected to said metal wiring, and a sealed region for sealing the periphery of the bump by a sealing material;
    edge sides of said solid-state image pickup device chip and those of said hermetic seal portion being substantially coincident with each other;
    wherein a wiring region or an electrode pad region is formed from an electrode pad provided on said solid-state image pickup device chip via said bump and said metal wiring to a side surface or through the side surface to a back surface of said solid-state image pickup device chip so that an external terminal can be electrically connected to the wiring region or the electrode pad region.

4. The solid-state image pickup apparatus according to claim 3, wherein an anisotropic conductive material is used as said sealing material.

5. A fabricating method of solid-state image pickup apparatus having a hermetic seal portion provided over a solid-state image pickup device chip comprising a flat-plate portion formed of a transparent member and a frame portion disposed at a side portion of a lower surface of the flat-plate portion, said fabricating method of solid-state image pickup apparatus including the steps of:
    over an entire wafer having a large number of solid-state image pickup device chips formed thereon, integrally and at once in a manner corresponding to each individual solid-state image pickup device chip, forming a hermetic seal portion comprising a flat-plate portion made of a transparent member, and a frame portion at least including a metal wiring disposed at a side portion of a lower surface of the flat plate portion, a bump formed on said solid-state image pickup device chip and electrically connected to the metal wiring, and a seal region for sealing the periphery of the bump by a sealing material so that the frame portion is disposed on the lower surface of the flat-plate portion where a transparent member extended over the entire wafer is used as the flat-plate portion; and
    separating the wafer having the hermetic seal portions formed integrally and at once thereon into solid-state image pickup device chips each having an individual hermetic seal portion.

* * * * *